(12) United States Patent
Komatsu

(10) Patent No.: US 10,163,752 B2
(45) Date of Patent: Dec. 25, 2018

(54) SEMICONDUCTOR DEVICE

(71) Applicant: FUJI ELECTRIC CO., LTD., Kawasaki-shi (JP)

(72) Inventor: Kousuke Komatsu, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/141,088

(22) Filed: Apr. 28, 2016

(65) Prior Publication Data

US 2016/0379912 A1 Dec. 29, 2016

(30) Foreign Application Priority Data

Jun. 29, 2015 (JP) .................................. 2015-130242

(51) Int. Cl.
*H01L 23/10* (2006.01)
*H01L 23/373* (2006.01)
*H01L 23/047* (2006.01)
*H01L 23/24* (2006.01)

(52) U.S. Cl.
CPC ........ *H01L 23/3735* (2013.01); *H01L 23/047* (2013.01); *H01L 23/3737* (2013.01); *H01L 23/24* (2013.01); *H01L 2224/32225* (2013.01); *H01L 2924/181* (2013.01); *H01L 2924/19107* (2013.01)

(58) Field of Classification Search
CPC ............... H01L 23/3735; H01L 23/047; H01L 23/3114; H01L 23/373–23/3738; H01L 31/024; H01L 31/052; H01L 33/64–33/648

USPC ................................................. 257/706, 707
See application file for complete search history.

(56) References Cited

U.S. PATENT DOCUMENTS

| | | | |
|---|---|---|---|
| 6,122,170 A * | 9/2000 | Hirose | .................. C04B 37/026 174/16.3 |
| 9,578,754 B2 * | 2/2017 | Ono | ....................... H01L 23/296 |
| 2002/0167062 A1* | 11/2002 | Narita | .................. H01L 31/0203 257/433 |
| 2006/0043583 A1* | 3/2006 | Tamagawa | ............... H01L 23/36 257/720 |
| 2013/0175703 A1* | 7/2013 | Takaragi | ................ H01L 23/053 257/774 |
| 2016/0027711 A1* | 1/2016 | Harada | .................... H01L 25/07 257/698 |

(Continued)

FOREIGN PATENT DOCUMENTS

| | | |
|---|---|---|
| JP | 2005-032912 A | 2/2005 |
| JP | 2008-277483 A | 11/2008 |
| JP | 2014-175612 A | 9/2014 |

*Primary Examiner* — Kevin M Picardat
(74) *Attorney, Agent, or Firm* — Manabu Kanesaka

(57) ABSTRACT

There is provided a semiconductor device provided with a metal base, a frame-shaped resin case adhered to the metal base, a semiconductor chip having a main electrode and being disposed inside the resin case, a main terminal having an internal end which is electrically connected to the main electrode of the semiconductor chip, integrally fixed to the resin case, and exposed inside the resin case and an external end exposed outside the resin case, a heat dissipation member which is placed, in contact with the metal base, between the metal base and the internal end of the main terminal, and has higher thermal conductivity than that of the resin case.

16 Claims, 5 Drawing Sheets

(56) References Cited

U.S. PATENT DOCUMENTS

2016/0190038 A1* 6/2016 Koyama ............ H05K 7/20927
257/693

* cited by examiner

SEMICONDUCTOR DEVICE

RELATED APPLICATIONS

The present application is based on, and claims priority from, Japanese Application No. JP2015-130242 filed Jun. 29, 2015, the disclosure of which is hereby incorporated by reference herein in its entirety.

TECHNICAL FIELD

The present invention relates to a semiconductor device.

BACKGROUND ART

FIG. 9 depicts an example of a power semiconductor module which is a semiconductor device used, for example for, electric power control. The power semiconductor module 101 is provided with a metal base 102, a laminated board 103, a semiconductor chip 105, a frame-shaped resin case 106 adhered to the metal base, and an external terminal integrally fixed to the resin case 106.

The external terminal of the power semiconductor module 101 is categorized roughly into two kinds, one of which is a main terminal 107. The main terminal 107 has a main function to flow main electric current via, for example, a main electrode of the semiconductor chip 105. The other is a control terminal. The control terminal has a main function to input a control signal to the control electrode of the semiconductor chip or to direct a signal for detection of the main electric current.

The main terminal 107 is integrally fixed to the resin case 106 by, for example, insert molding. The one end of the main terminal 107 is exposed inside the resin case 106 and electrically connected to the circuit plate of laminated board 103 or to the main electrode of the semiconductor chip 105 by, for example, a bonding wire. The other end of the main terminal 107 is exposed outside the resin case and connected to another apparatus via, for example, a bus bar.

Electric current flowing though the main terminal 107 generates heat in the main terminal 107 due to the electric resistance of the main terminal 107 itself. The heat generation in the main terminal 107 may raise the temperature of the entire power semiconductor module 101. The heat generation in the main terminal 107 may also raise the temperature of another apparatus connected via, for example, a bus bar. As miniaturization and high current density have been required for power semiconductor modules in recent years, it is required to reduce the influence of the heat generation in the main terminal 107.

There is provided a semiconductor device which has a terminal arranged, with intervention of an insulation layer, above an electrical conductive board and is provided with a metal component placed so as to be in contact with the terminal surface on the side of the electrically conductive board (Patent Document 1). However, when multiple main terminals are placed in row, the width of the metal component described in Patent Document 1 is constrained by the insulation distance between the main terminals which has to be secured. Accordingly, heat dissipation from the main terminal is also limited.

RELATED ART DOCUMENT

Patent Document

Patent Document 1 Japanese Laid-open Patent publication No. 2014-175612

SUMMARY OF THE INVENTION

Problems to be Solved by the Invention

The present invention is to solve the above-mentioned problem advantageously, and an object of the invention is to provide a semiconductor device which can improve heat dissipation from the main terminal.

Means for Solving the Problems

A semiconductor device of one aspect of the present invention is provided with a metal base, a frame-shaped resin case adhered to the metal base, a semiconductor chip having a main electrode and being disposed inside the resin case, a main terminal having an internal end which is electrically connected to the main electrode of the semiconductor chip, integrally fixed to the resin case, and exposed inside the resin case and an external end exposed outside the resin case, and a heat dissipation member which is placed, in contact with the metal base, between the metal base and the internal end of the main terminal, and has a higher thermal conductivity than that of the resin case.

Effect of the Invention

The semiconductor device of the present invention can improve the heat dissipation from the main terminal.

MODE FOR CARRYING OUT THE INVENTION

Embodiment 1

An embodiment of a semiconductor device of the present invention will be hereinafter specifically explained with reference to the drawings.

Figure 1:
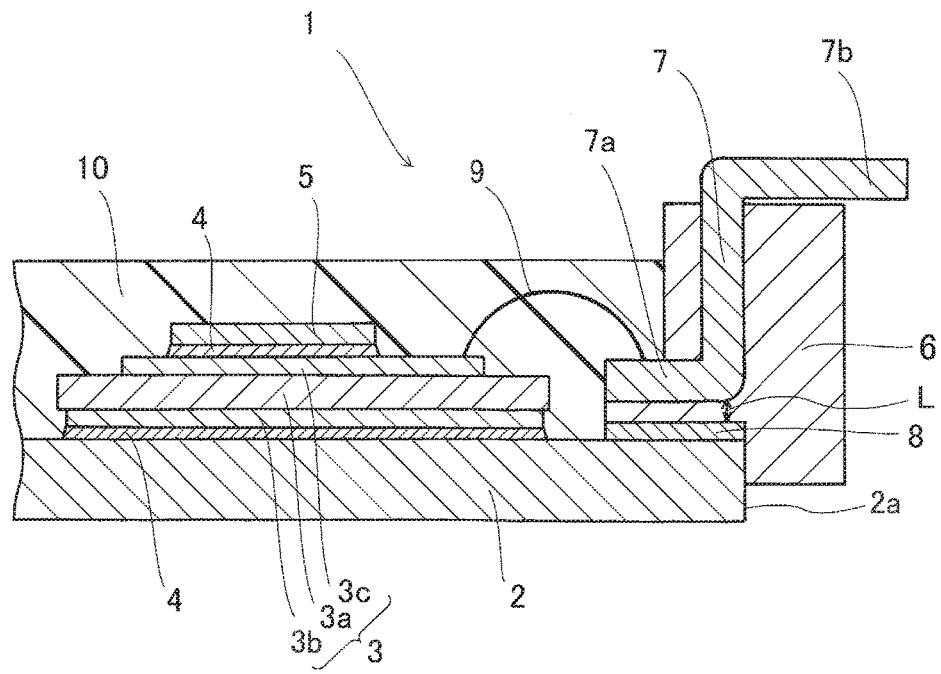
FIG. 1 is a schematic cross-sectional view of a semiconductor device of one embodiment of the present invention.

A power semiconductor module 1 which is a semiconductor device of the embodiment depicted by a schematic cross-sectional view in FIG. 1 is provided with a metal base 2, a semiconductor chip 5, a resin case 6, a main terminal 7, and a metal block 8 which is a heat dissipation member. The power semiconductor module 1 is additionally provided with a laminated board 3, a bonding wire 9, and a sealing material 10.

The metal base 2 is made from a metal having excellent thermal conductivity, for example, such as copper or aluminum, and outwardly dissipates heat generated by the semiconductor chip 5 and the main terminal 7. The metal base 2 has an approximately rectangular planar shape.

The laminated board 3 has an approximately rectangular planar shape smaller than the metal base 2. The laminated board 3 has a laminated structure of a circuit plate 3c, an insulation plate 3a, and a metal plate 3b. The insulation plate 3a and the metal plate 3b have an approximately rectangular planar shape. The circuit plate 3c has a pattern shape which configures a predetermined circuit within the power semiconductor module 1. The insulation plate 3a is made from an insulating ceramics, for example, such as aluminum nitride, silicon nitride, or aluminum oxide, and the metal plate 3b and the circuit plate 3c are made from, for example, copper or aluminum. For the laminated board 3, for example, a DCB (Direct Copper Bond) board or an AMB (Active Metal Blazing) board can be used. The metal plate 3b of the laminated board 3 and the main surface of the metal base 2 are bonded by a bonding material 4 such as solder.

The semiconductor chip 5 is provided with a main electrode and a control electrode on the front surface thereof, and another main electrode on the back surface thereof. The main electrode on the back surface is electrically and mechanically connected to one region of the circuit plate 3c via a solder 4. The expression "electrically and mechanically connected" is supposed to include not only connection of objects by direct bonding but also the connection thereof via an electrically conductive bonding material such as solder or a sintered metal material, as is the same in the following explanation. The main electrode on the front surface is electrically connected by a wiring member not depicted, such as a bonding wire, to the circuit plate 3c or the main terminal 7. The control electrode on the front surface is electrically connected by a wiring member not depicted, such as a bonding wire, to the circuit plate 3c or a control terminal.

Specifically, the semiconductor chip 5 is, for example, a power MOSFET or an IGBT (Insulation Gate Bipolar Transistors). The semiconductor chip 5 may be made from silicon semiconductor or SiC semiconductor. When the semiconductor chip 5 is a power MOSFET made from silicon carbide (SiC), since it has a higher voltage-withstanding property and is capable of switching at higher frequency than semiconductor chips made from silicon, it is most suitable as a semiconductor chip 5 for the semiconductor device of the embodiment. However, the semiconductor chip 5 is not limited to an IGBT and a power MOSFET, and it may be a single or a combination of multiple semiconductor elements capable of switching operation.

On the periphery of the metal base 2, a frame-shaped resin case 6 is placed and adhered by adhesive not depicted. The resin case 6 has the laminated board 3 and the semiconductor chip 5 placed thereinside. The resin case 6 is made from an insulating resin, such as PPS (polyphenylene sulfide) resin, PBT (polybutylene terephthalate) resin, or urethane resin. The resin case 6 has the main terminal 7 integrally fixed thereto. The main terminal 7 has an internal end 7a exposed inside the resin case 6, and an external end 7b exposed outside the upper part of the resin case 6. Each of the ends of the main terminal 7 is bent into an L-shape. In the embodiment, the internal end 7a of the main terminal 7 and the circuit plate 3c are electrically connected by the bonding wire 9.

The inside of the frame of the resin case 6 is sealed by a gelled sealing material 10 in order to enhance insulation against the laminated board 3, the semiconductor chip 5, and bonding wire 9. The resin case 6 has a cap, not depicted, fixed to the upper portion thereof. The cap, the resin case 6, and the metal base 2 configures the housing of the power semiconductor module 1.

Between the internal end 7a of the main terminal 7 and the metal base 2, a metal block 8 which is a heat dissipation member, is placed in contact with the metal base 2. The metal block 8 is made of a highly thermally conductive metal material, such as copper or aluminum. As thermal expansion is taken into account, the material for the metal block 8 is preferably the same as the material of the metal base 2 because thermal stress can be suppressed. The metal block 8 has higher thermal conductivity than that of the resin case 6, which means excellent thermally conductivity.

The resin case 6 intervenes between the internal end 7a of the main terminal 7 and the metal block 8, and thereby insulation between the main terminal 7 and metal base 2 is secured. In other words, the distance L between the internal end 7a and the metal block 8 is sufficient to secure the insulation therebetween. As heat dissipation is taken into account, the distance between the internal end 7a and the metal block 8 is preferably a minimal thickness sufficient to secure the insulation. Specifically, 0.5 mm is sufficient.

The metal block 8 can be fixed to the metal base 2 by adhesion, solder bonding, brazing, and so on. Adhesion by adhesive can fix the metal block 8 and the metal base 2 easily. When adhesive is used, heat dissipation can be enhanced by using a minimum necessary amount of the adhesive. On the other hand, when solder bonding or brazing is used for fixing the metal block, heat dissipation to the metal base 2 can be enhanced even more.

By applying adhesive only to a region in which the side surface 2a of the metal base 2 and the resin case 6 are in contact with each other, the side surface 2a of the metal base 2 and the resin case 6 can be also fixed to each other. In this case, an example is also possible in which adhesive is not applied to a region between the metal block 8 and the metal base 2.

In the assembly process of the power semiconductor module 1, after fixing the metal block 8 to the metal base 2, the resin case 6 can be fixed to the metal base 2 and the metal block 8 by adhesive. Alternatively, after integrally fixing the metal block 8 and the main terminal 7 to the resin case 6 by insert molding, the metal block 8 integrated with the resin case 6 can be fixed to the metal base 2 by adhesive. The integration of the metal block 8 and the resin case 6 by insert molding can improve the workability of placing metal block 8 on the metal base 2.

Figure 2:
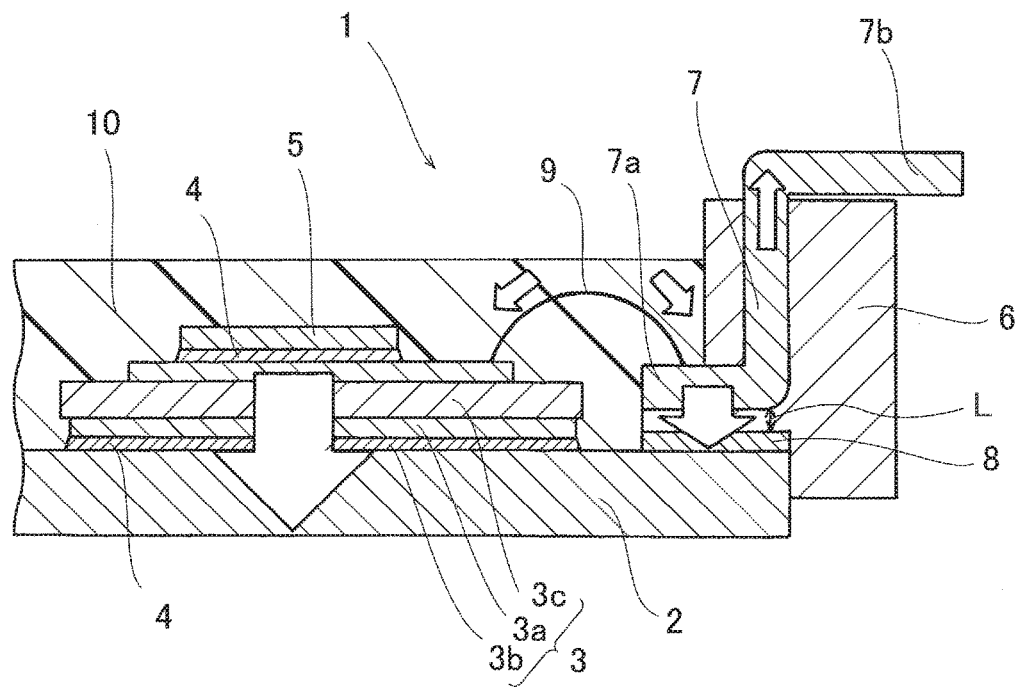
FIG. 2 is an explanatory figure of heat dissipation of the semiconductor device of FIG. 1.

FIG. 2 schematically indicates by arrows paths and amounts of the heat dissipation in the power semiconductor module 1 depicted in FIG. 1. In the drawing, a larger arrow represents a larger amount of heat dissipation.

The power semiconductor module 1 of the embodiment is provided with the metal block 8 between the metal base 2 and the internal end 7a of the main terminal 7, the metal block having higher thermal conductivity than that of the resin case 6. For this reason, heat generated from the main terminal 7 can be effectively dissipated from the internal end 7a to the metal base 2 via the metal block 8. Accordingly, heat dissipation via the metal block 8 is possible in addition to heat dissipation from the bonding wire 9 via the laminated board 3, and heat dissipation from the main terminal 7 can be improved than conventionally achieved.

Figure 3A:
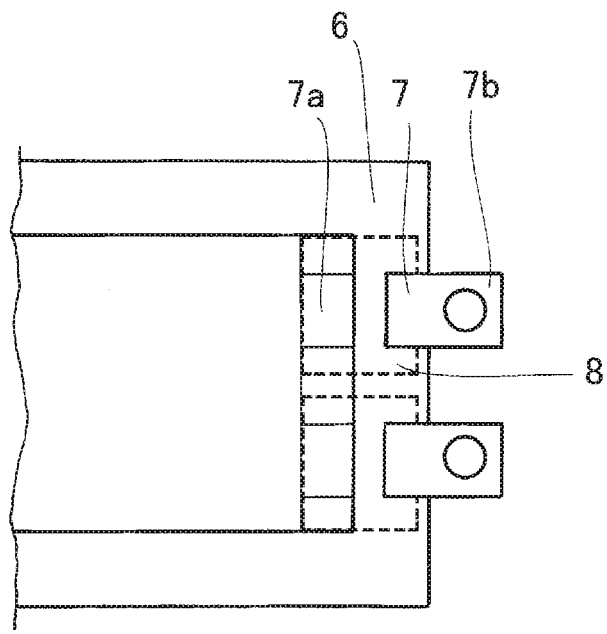
FIG. 3(a) and FIG. 3(b) are plan views of the proximity of the main terminal of the semiconductor device of FIG. 1.
Figure 3B:
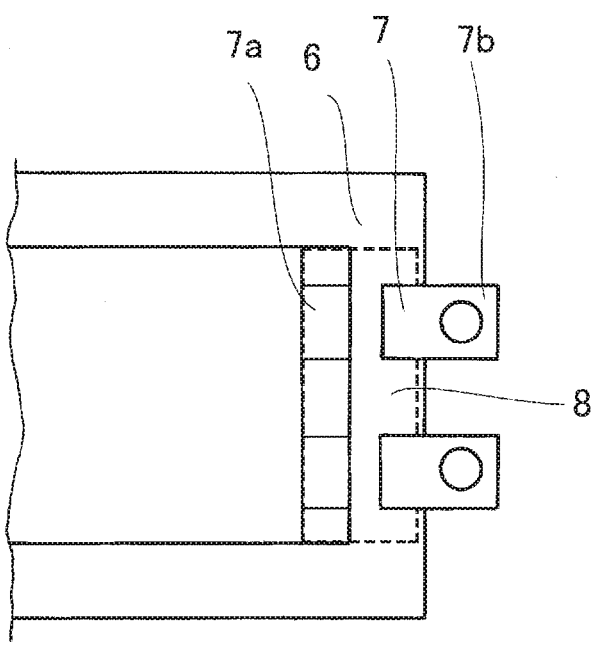

FIG. 3(a) and FIG. 3(b) depict plan views in the vicinity of the main terminal 7 of the power semiconductor module 1 of FIG. 1. In FIG. 3(a) and FIG. 3(b), the depiction of the semiconductor chip 5 and others are omitted for better understanding of the invention.

The semiconductor device described in Patent Document 1 has a metal component placed in contact with the terminal. Accordingly, when multiple terminals are arranged in row, a large width of the metal component may bring the metal components into contact with each other, resulting in a short between terminals.

On the other hand, in the embodiment, when plural main terminals 7 are placed as depicted in FIG. 3(a), the width of the metal blocks 8 corresponding to the terminals can be larger than the width of the main terminals 7. The reason for this is as follows: Even if the respective metal blocks 8 come close to each other, insulation between the main terminals 7 and the metal blocks 8 is secured because the resin case 6 intervenes between the main terminals 7 and the metal blocks 8; accordingly, even if the metal blocks 8 are in contact with each other, insulation between main terminals 7 are secured. Hence, in the embodiment, the width of heat dissipation paths from the metal blocks 8 to the metal base 2 can be large, resulting in improvement in heat dissipation.

Further, as depicted in FIG. 3(b), when plural main terminals 7 are placed in parallel, an integrated metal block 8 can be placed which extends over the plural main terminals 7. A metal block 8 having a wider width can improve the heat dissipation effect. Further, the placement of respective metal blocks 8 is not necessary, resulting in a simplified manufacturing process of the module.

Figure 4:
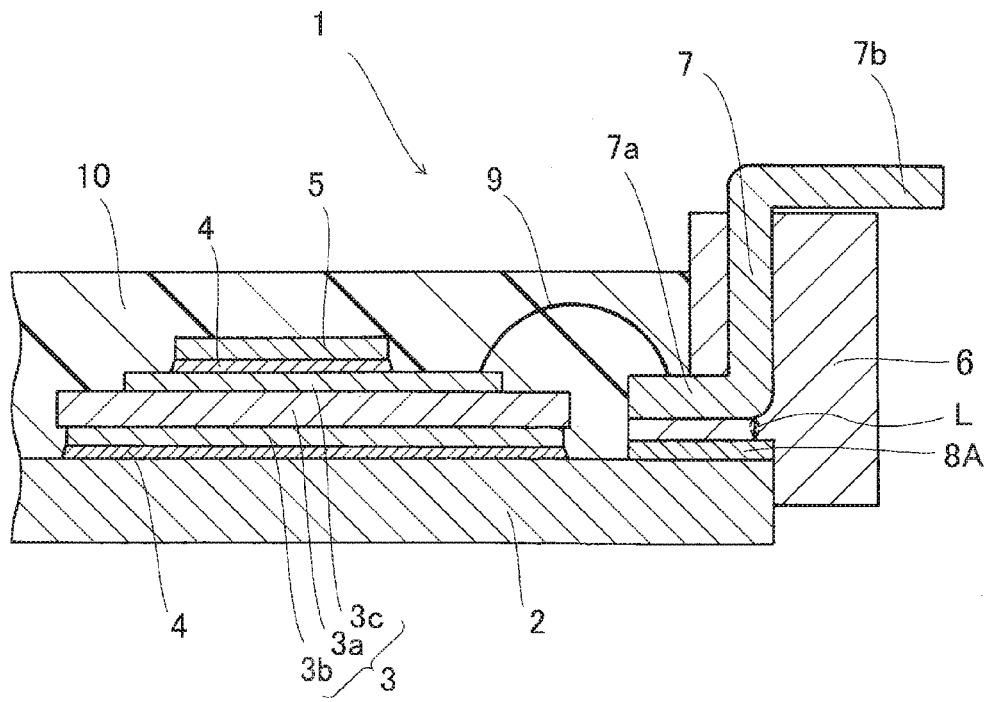
FIG. 4 is a schematic cross-sectional view of a variation example of the semiconductor device of FIG. 1.

As a variation example of the power semiconductor module 1 of the embodiment, a ceramic block 8A with higher thermal conductivity than that of the resin case 6 can be also used instead of the metal block 8, as depicted in FIG. 4.

Figure 5:
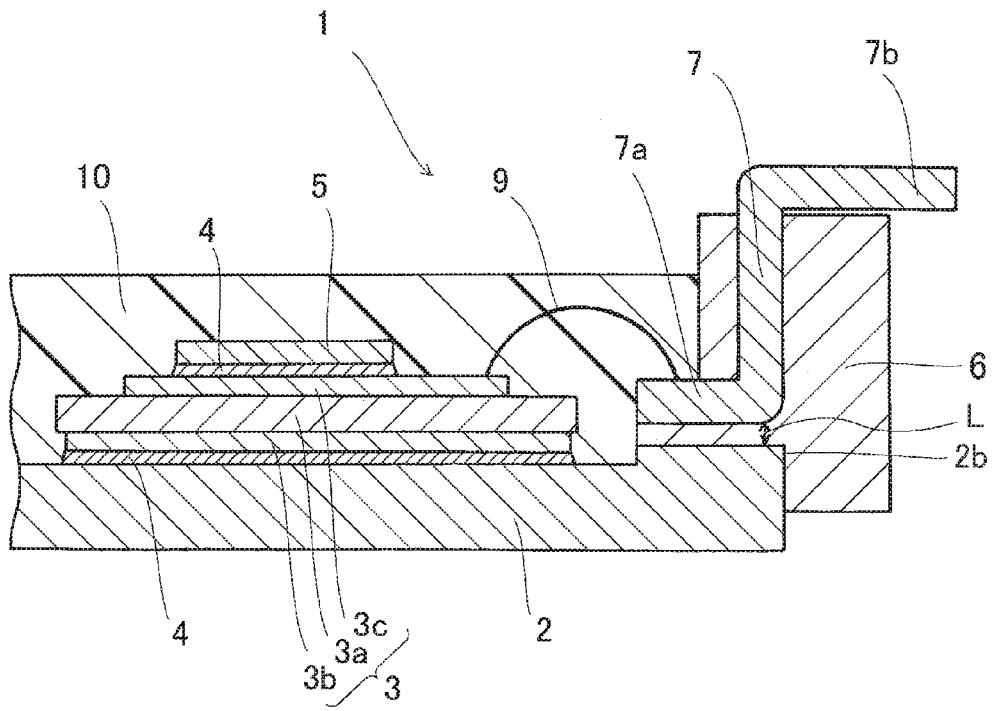
FIG. 5 is a schematic cross-sectional view of a variation example of the semiconductor device of FIG. 1.

As another variation example of the power semiconductor module 1 of the embodiment, an aspect is possible in which the metal base 2 has a projection 2b instead of the metal block 8, the projection having the same shape as that of the metal block 8, as depicted in FIG. 5.

Figure 6:
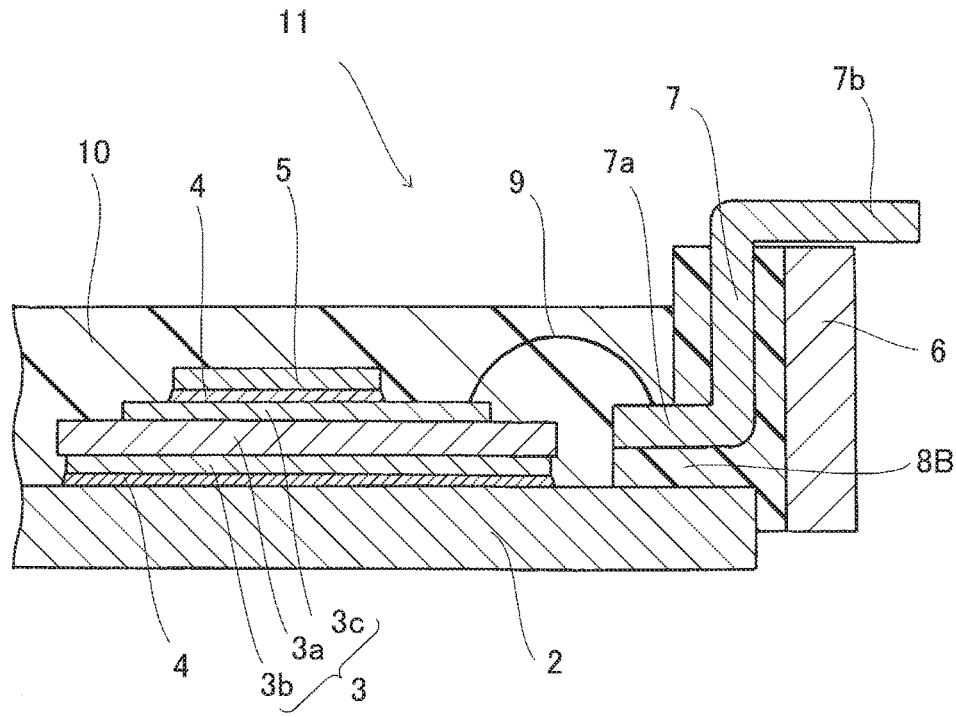
FIG. 6 is a schematic cross-sectional view of another embodiment of the present invention.

A power semiconductor module 11 of another embodiment of the invention is explained by using the schematic cross-sectional view in FIG. 6. In the power semiconductor module 11 depicted in FIG. 6, identical symbols are assigned to the same members as those depicted in FIG. 1. Accordingly, in the following explanations, those duplicated with the above explanations for the respective members will be omitted.

The power semiconductor module 11 in FIG. 6 has a thermally conductive resin 8B, as a heat dissipation member with higher thermal conductivity than that of the resin case 6, placed between the metal base 2 and the internal end 7a of the main terminal 7. More specifically, the thermally conductive resin 8B forms a part of the resin case 6, covers the main terminal 7, and is placed in contact with the metal base 2.

For the thermally conductive resin 8B, a resin can be used having higher thermal conductivity than PPS resin, PBT resin, and urethane resin which are the material of the resin case 6. PPS resin, PBT resin, and urethane resin have a thermal conductivity the upper limit of which is about 0.33 W/m·K. If a resin having a thermal conductivity of, for example, 17 W/m·K or more is used as the thermally conductive resin 8B, heat dissipation from the main terminal 7 can be improved. In addition, a resin having thermal conductivity enhanced by adding highly thermally conductive filler thereto can be used as the thermally conductive resin 8B.

The thermally conductive resin 8B is a resin having an insulating property. Accordingly, only the thermally conductive resin 8B can be placed between the metal base 2 and the internal end 7a of the main terminal 7 without intervention of the resin of the resin case 6 having low thermal conductivity.

The thermally conductive resin 8B placed in such a way as to cover the main terminal 7 can be integrated by insert molding of the main terminal 7 and the thermally conductive resin 8B. Attaching the main terminal 7 integrated with the thermally conductive resin 8B to a metal mold for molding the resin case 6, followed by insert molding, can provide the resin case 6 having the main terminal 7 integrated with the thermally conductive resin 8B.

Figure 7:
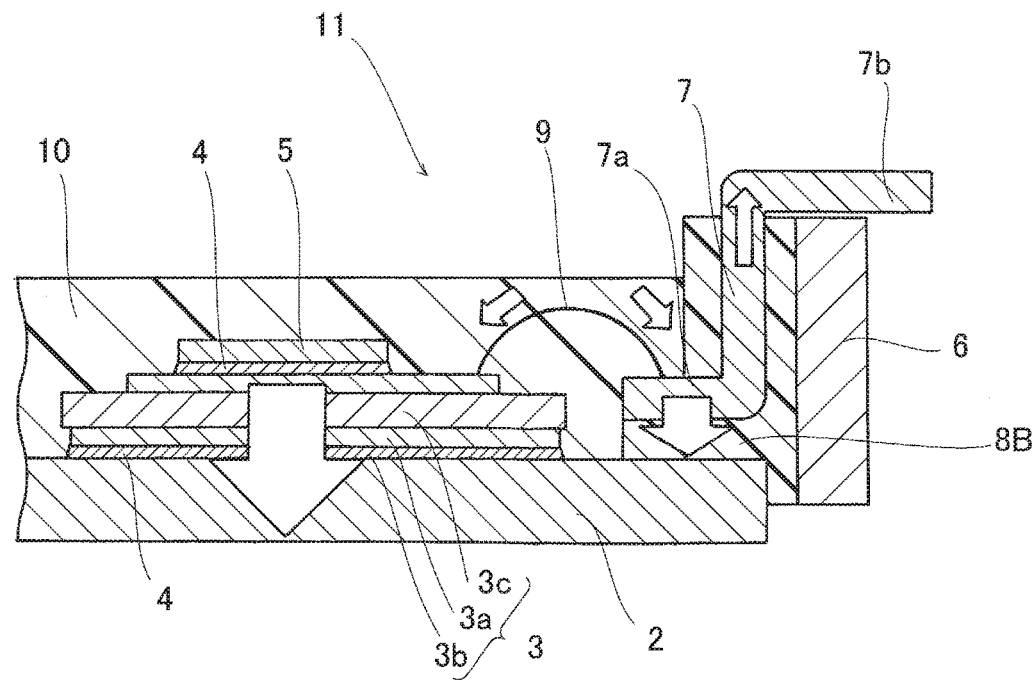
FIG. 7 is an explanatory figure of heat dissipation of the semiconductor device of FIG. 6.

In FIG. 7, paths and amounts of heat dissipation in the power semiconductor module 1 depicted in FIG. 6 are indicated schematically by arrows. In the drawing, a larger arrow indicates a larger amount of heat dissipation.

The power semiconductor module 11 of the embodiment is provided with the thermally conductive resin 8B between the metal base 2 and the internal end 7a of the main terminal 7, the resin having higher thermal conductivity than that of the resin case 6. For this reason, heat generated from the main terminal 7 can be effectively dissipated from the internal end 7a to the metal base 2 via the thermally conductive resin 8B. Accordingly, heat dissipation via the thermally conductive resin 8B can be possible in addition to heat dissipation from a bonding wire 9 via a laminated board 3, resulting in improvement in the heat dissipation from the main terminal 7 relative to conventional modules.

The thermally conductive resin 8B may be placed, in contact with the metal base 2, only between the metal base and the internal end 7a of the main terminal 7. In addition, as depicted in FIG. 6, the thermally conductive resin 8B can be placed in such a way as to form a part of the resin case 6 and to cover the main terminal 7. The thermally conductive resin 8B placed in such a way as to cover the main terminal 7 can improve heat dissipation from the main terminal 7 even more because of the large area thereof in contact with the main terminal 7.

The thermally conductive resin 8B can be relatively freely positioned within the resin case 6. For example, when a minimum necessary amount of the thermally conductive resin 8B is placed between the metal base 2 and the internal end 7a of the main terminal 7, increase in costs can be suppressed. The thermally conductive resin 8B can be also placed up as far as the external sidewall of the resin case 6 to dissipate, from the sidewall of the resin case 6, heat from the main terminal 7. Further, in this case, the sidewall surface of the resin case 6 can also be made bumpy to increase the surface area to enhance heat dissipation.

Figure 8:
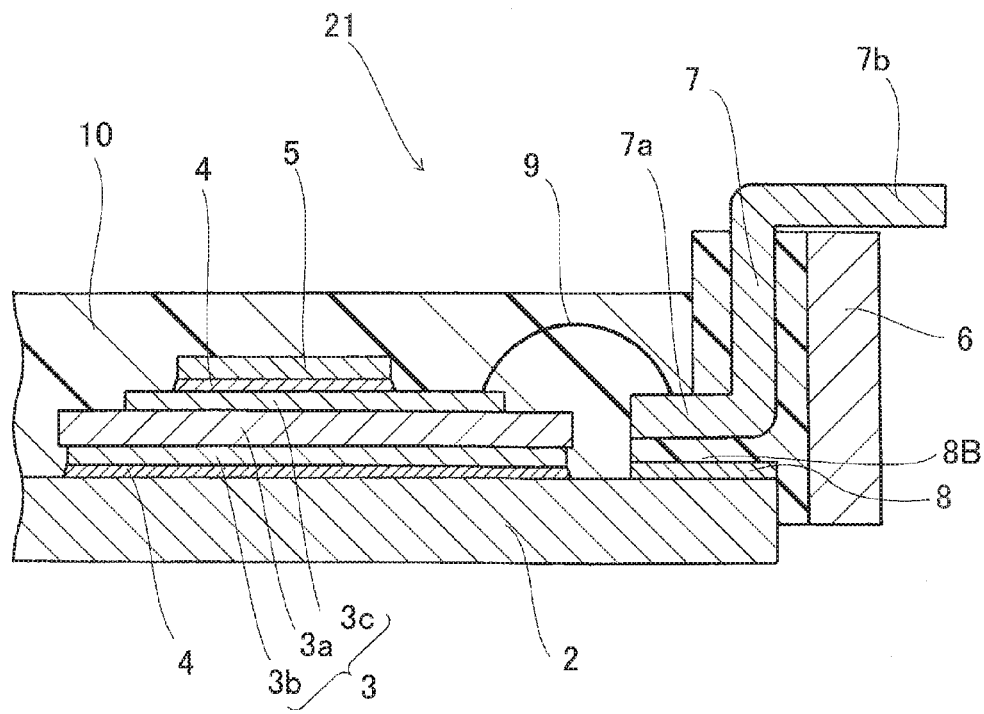
FIG. 8 is a schematic cross-sectional view of another embodiment of the present invention.
Figure 9:
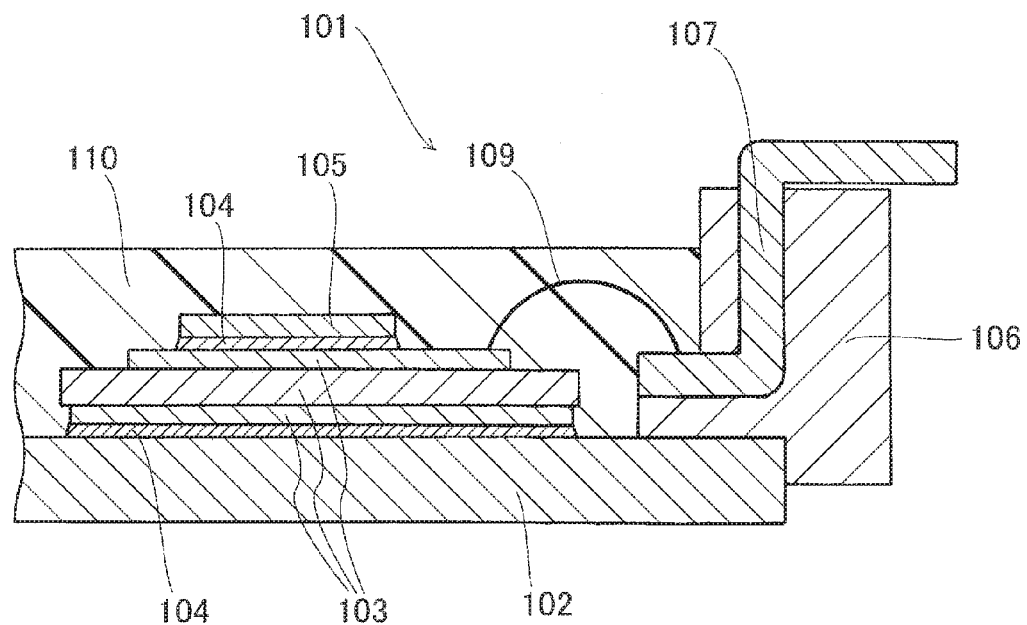
FIG. 9 is a schematic cross-sectional view of a conventional semiconductor device.

By using the schematic cross-sectional view depicted in FIG. 8, a power semiconductor module 21 of another embodiment of the present invention is explained. In FIG. 8, as identical symbols are assigned to the same members as those used in FIG. 1 and FIG. 6, explanations duplicated with the above explanations will be omitted.

The power semiconductor module 21 of FIG. 8 has a metal block 8 placed between a metal base 2 and the internal end 7a of a main terminal 7, the metal block being in contact with the metal base 2. Further, a thermally conductive resin 8B is placed in such a way as to cover the main terminal 7.

As the power semiconductor module 21 of the embodiment is provided with the metal block 8, which is a heat dissipation member, and the thermally conductive resin 8B, heat generated by the main terminal 7 can be efficiently dissipated from the internal end 7a to the metal base 2.

A method of manufacturing the power semiconductor module of the embodiment will be explained.

An example of the method of manufacturing the power semiconductor module 1 depicted in FIG. 1 provided with the metal block 8 includes a process for forming a resin case 6 to which the main terminal 7 and the metal block 8 are fixed integrally.

More specifically, this process (1) places the main terminal 7 and the metal block 8 in a metal mold for insert molding, (2) aligns the upper and lower parts of the metal mold for insert molding, (3) fills the metal mold with a resin for the resin case 6, followed by solidification, (4) then opens the upper and lower parts of the metal mold to take out and cool the resin case 6, (5) and removes burrs to complete the module. These steps from (1) to (5) are similar to those of processes of molding a resin case 6 to which a main terminal is fixed integrally, and can manufacture a power semiconductor module having a main terminal 7 exhibiting an improved heat dissipation property without increase in the number of manufacturing steps relative to conventional processes.

The example of the method of manufacturing the power semiconductor module 11 depicted in FIG. 6 provided with the thermally conductive resin 8B includes a process of forming the resin case 6 to which the main terminal 7 and the thermally conductive resin 8B are fixed integrally. More specifically, this process (1) places the main terminal 7 in a first metal mold for insert molding, (2) aligns the upper and lower parts of the first metal mold for insert molding, (3) fills the metal mold with the thermally conductive resin 8B, followed by solidification, (4) then opens the upper and lower parts of the metal mold to take out and cool the main terminal 7 integrated with the thermally conductive resin 8B, (5) and removes burrs to complete a main terminal member. Then the process (6) places the main terminal member in a second metal mold for insert molding, (7) aligns the upper and lower part of the second metal mold for insert molding, (8) fills the metal mold with a resin for the resin case 6 and solidifies the resin, (9) opens the upper and lower parts of the metal mold to take out and cool the resin case 6, (10) and removes burrs to complete the module. These steps from (1) to (10) are similar to those of processes of molding a resin case 6 to which a main terminal is fixed integrally, and can manufacture a power semiconductor module having a main terminal 7 exhibiting an improved heat dissipation property without increase in the number of manufacturing steps relative to conventional processes.

As described above, the semiconductor device of the present invention was explained specifically by using the drawings and the embodiments, but the semiconductor device of the invention is not limited to the description of the embodiments and the drawings, and many variations are possible without departing from the spirit of the invention.

DESCRIPTION OF SYMBOLS 1, 11, 21 power semiconductor module
2 metal base
3 laminated board
3a insulation plate
3b metal plate
3c circuit plate
4 bonding material
5 semiconductor chip
6 resin case
7 main terminal
7a internal end
7b external end
8 metal block
8A ceramic block
8B thermally conductive resin
9 bonding wire
10 sealing material

What is claimed is:

1. A semiconductor device comprising:
   a metal base;
   a frame-shaped resin case adhered to the metal base;
   a semiconductor chip having a main electrode and being disposed inside the resin case;
   a laminated board on which the semiconductor chip is mounted, the laminated board being fixed to the metal base;
   a main terminal integrally fixed to the resin case, and having an internal end exposed inside the resin case and an external end exposed outside the resin case;
   a bonding wire electrically connecting the main electrode of the semiconductor chip and the internal end of the main terminal;
   a heat dissipation member which is spaced from the semiconductor chip and the laminated board, and which is placed, in contact with the metal base, between the metal base and the internal end of the main terminal, and has higher thermal conductivity than that of the resin case; and
   a sealing material sealing an inside of the resin case and filling a space between the semiconductor chip and the heat dissipation member,
   wherein the heat dissipation member is integrally formed with the resin case.

2. The semiconductor device according to claim 1, wherein the heat dissipation member has a width larger than a width of the main terminal in a width direction perpendicular to a direction from the main terminal to the semiconductor chip.

3. The semiconductor device according to claim 2, further comprising at least one another main terminal arranged side by side with the main terminal in the width direction,
   wherein the heat dissipation member is placed extending over the main terminal and the at least one another main terminal in the width direction.

4. The semiconductor device according to claim 1, wherein the heat dissipation member is a metal block.

5. The semiconductor device according to claim 1, wherein the heat dissipation member is a thermally conductive resin.

6. The semiconductor device according to claim 5, wherein the thermally conductive resin covers the main terminal.

7. The semiconductor device according to claim 5, wherein the thermally conductive resin forms a part of the resin case.

8. The semiconductor device according to claim 2, wherein the heat dissipation member is a metal block.

9. The semiconductor device according to claim 3, wherein the heat dissipation member is a metal block.

10. The semiconductor device according to claim 2, wherein the heat dissipation member is a thermally conductive resin.

11. The semiconductor device according to claim 3, wherein the heat dissipation member is a thermally conductive resin.

12. The semiconductor device according to claim 1, wherein the heat dissipation member is a ceramic block.

13. The semiconductor device according to claim 1, wherein the heat dissipation member is arranged between the metal base and the internal end of the main terminal, and is fixed onto the metal base by adhesion, solder bonding or brazing.

14. The semiconductor device according to claim 1, wherein the heat dissipation member is a thermally conductive resin having an insulating property with higher thermal conductivity than that of the resin case, and is a part of the resin case covering the main terminal.

15. A semiconductor device comprising:
   a metal base;
   a frame-shaped resin case adhered to the metal base;
   a semiconductor chip having a main electrode and being disposed inside the resin case;
   a main terminal integrally fixed to the resin case, and having an internal end exposed inside the resin case and an external end exposed outside the resin case;
   a bonding wire electrically connecting the main electrode of the semiconductor chip and the internal end of the main terminal;
   a heat dissipation member which is spaced from the semiconductor chip and placed, in contact with the metal base, between the metal base and the internal end of the main terminal, and has higher thermal conductivity than that of the resin case; and
   a sealing material sealing an inside of the resin case and filling a space between the semiconductor chip and the heat dissipation member,
   wherein the heat dissipation member is vertically spaced from the internal end of the main terminal, and the resin case includes a portion formed of a thermally conductive resin having thermal conductivity higher than that of the resin case, a part of the portion formed of the thermally conductive resin extending inwardly to be interposed between the heat dissipation member and the internal end of the main terminal to secure insulation between the main terminal and the metal base.

16. The semiconductor device according to claim 15, wherein the portion formed of the thermally conductive resin is arranged at an inner side of the resin case, and the main terminal extends in the portion formed of the thermally conductive resin to expose the internal end and external end.

\* \* \* \* \*